US012592709B2

(12) United States Patent
    Yoshida

(10) Patent No.: US 12,592,709 B2
(45) Date of Patent: Mar. 31, 2026

(54) AD CONVERTER DEVICE, SEMICONDUCTOR INTEGRATED CIRCUIT DEVICE, AND DESIGNING METHOD OF AD CONVERTER DEVICE

(71) Applicant: Socionext Inc., Kanagawa (JP)

(72) Inventor: Minori Yoshida, Kanagawa (JP)

(73) Assignee: Socionext Inc., Yokohama (JP)

( * ) Notice: Subject to any disclaimer, the term of this patent is extended or adjusted under 35 U.S.C. 154(b) by 62 days.

(21) Appl. No.: 18/420,369

(22) Filed: Jan. 23, 2024

(65) Prior Publication Data

US 2024/0243752 A1     Jul. 18, 2024

Related U.S. Application Data

(63) Continuation of application No. PCT/JP2021/028278, filed on Jul. 30, 2021.

(51) Int. Cl.
    *H03M 1/12*     (2006.01)
    *H03M 1/10*     (2006.01)
    *H03M 1/44*     (2006.01)

(52) U.S. Cl.
    CPC ........ *H03M 1/1215* (2013.01); *H03M 1/1009* (2013.01); *H03M 1/1014* (2013.01); *H03M 1/1245* (2013.01); *H03M 1/44* (2013.01)

(58) Field of Classification Search
    CPC .. H03M 1/1215; H03M 1/1245; H03M 10/14; H03M 10/09; H03M 1/44
    See application file for complete search history.

(56) References Cited

U.S. PATENT DOCUMENTS

| 7,250,885 | B1 | 7/2007 | Nairn |
| 2003/0058144 | A1 | 3/2003 | Nakada |
| | | (Continued) | |

FOREIGN PATENT DOCUMENTS

| JP | 2002-100988 A | 4/2002 |
| JP | 2003-330987 A | 11/2003 |
| | (Continued) | |

OTHER PUBLICATIONS

International Search Report dated Sep. 7, 2023 issued in International Patent Application No. PCT/JP2021/028278, with English translation.

*Primary Examiner* — Joseph J Lauture
(74) *Attorney, Agent, or Firm* — Rimon P.C.

(57)     ABSTRACT

An AD converter device includes: a plurality of AD converter circuit units which performs analog-to-digital conversion in a time-interleaved manner; and a multiplexer circuit which generates a digital signal from output signals of the AD converter circuit units. The multiplexer circuit includes logic circuits and intermediate connection wirings placed to be distributed in the AD converter circuit units, the logic circuits are connected in a tournament configuration. In each of the AD converter circuit units, an output circuit and a first element circuit part including the logic circuit are placed along a first outer periphery and the intermediate connection wirings are placed to cross in a first direction. The AD converter circuit units are placed along the first direction with two adjacent ones of the AD converter circuit units set as a pair and with the output circuits and the first element circuit parts facing each other for each pair.

20 Claims, 13 Drawing Sheets

(56)          References Cited

U.S. PATENT DOCUMENTS

| | | | |
|---|---|---|---|
| 2003/0212977 A1 | 11/2003 | Kumagai | |
| 2005/0190095 A1 | 9/2005 | Wada et al. | |
| 2005/0247977 A1 | 11/2005 | Noda | |
| 2006/0275964 A1 | 12/2006 | Noda | |
| 2006/0279447 A1 | 12/2006 | Wada et al. | |
| 2010/0195776 A1 | 8/2010 | Chmelar et al. | |
| 2025/0192791 A1* | 6/2025 | Hong ................. | H03M 1/0624 |

FOREIGN PATENT DOCUMENTS

| | | | |
|---|---|---|---|
| JP | 2005-244872 A | 9/2005 | |
| JP | 2009-188093 A | 8/2009 | |
| JP | 2011-523294 A | 8/2011 | |
| JP | 2011-238011 A | 11/2011 | |
| JP | 2016-208393 A | 12/2016 | |

* cited by examiner

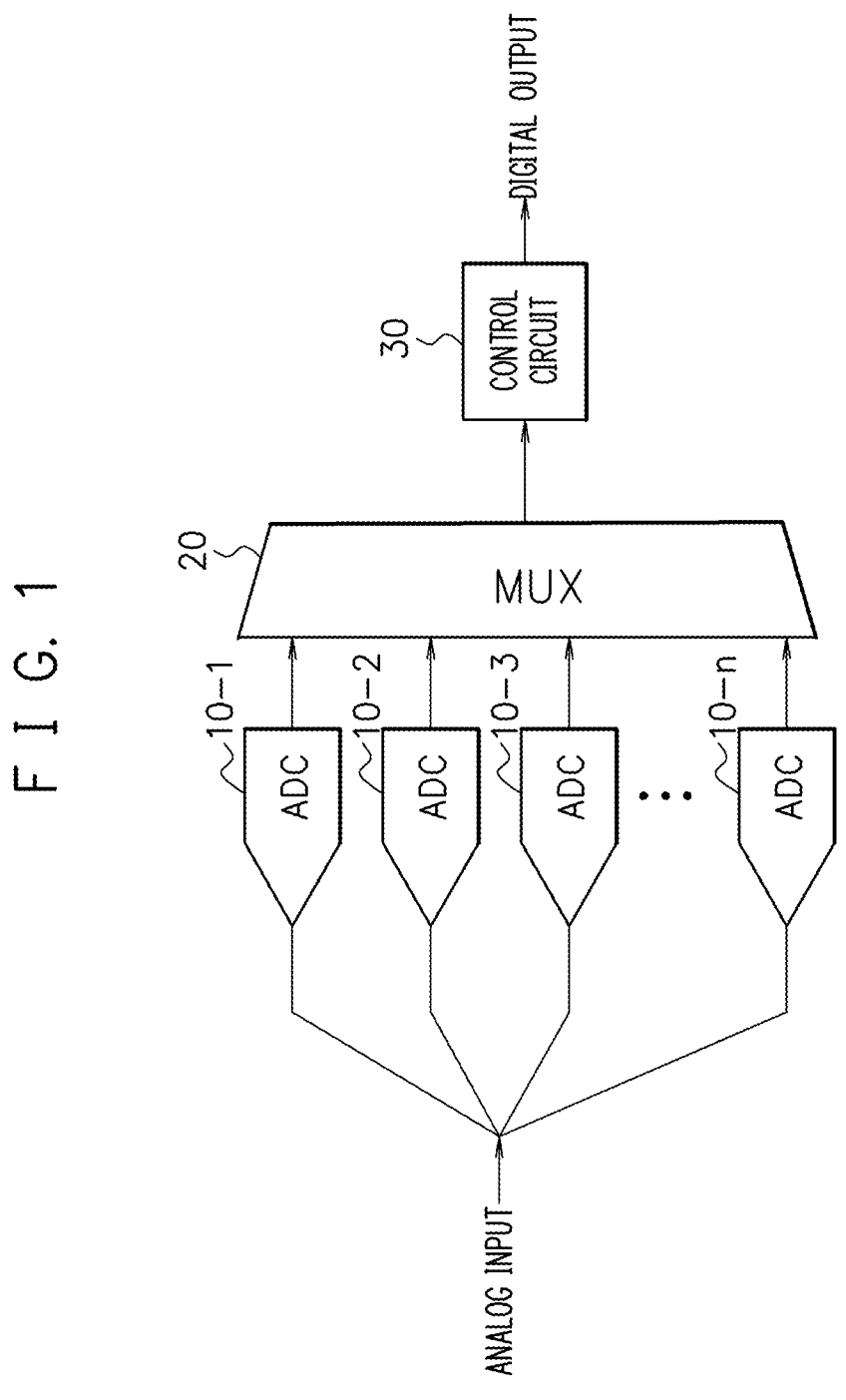
F I G. 1

F I G. 2A
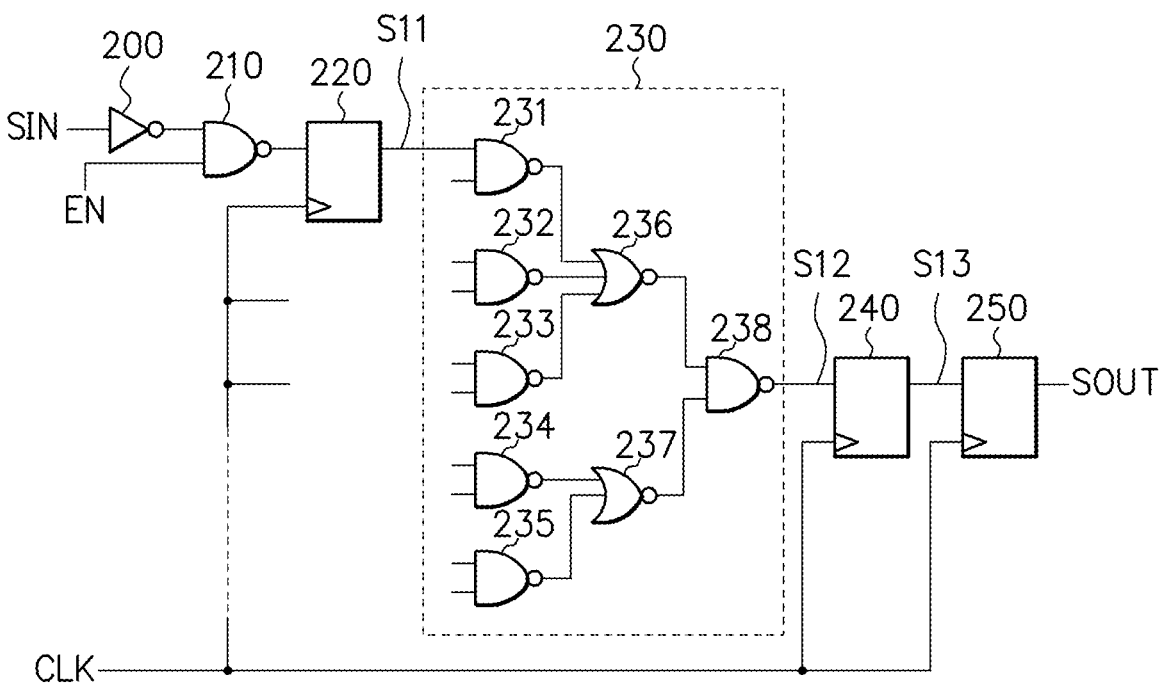
F I G. 2B
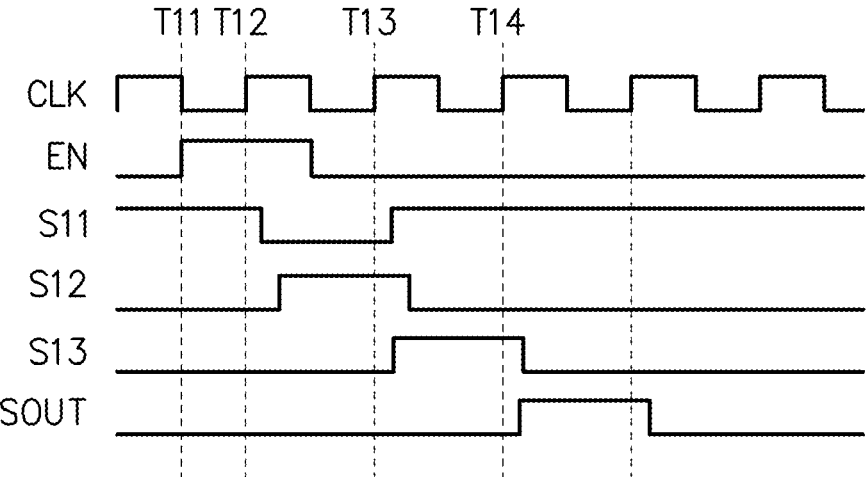

F I G. 3
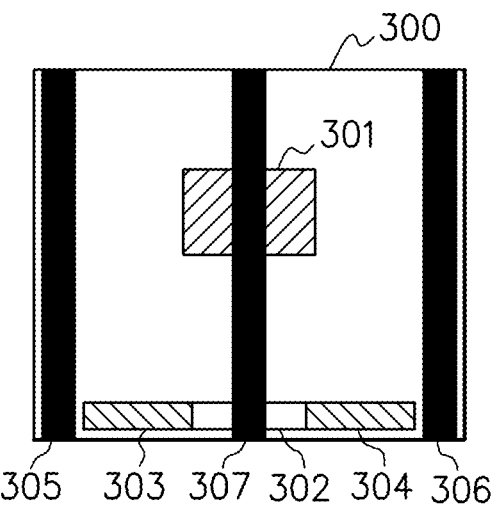
305   303   307   302   304   306
F I G. 4A
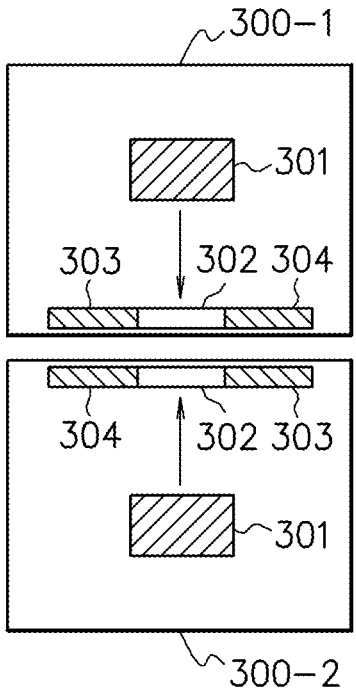

F I G. 4B
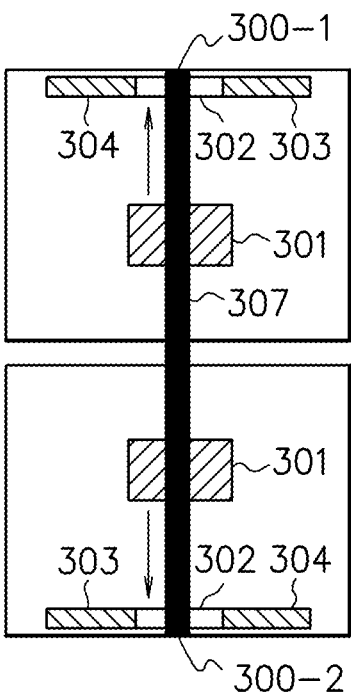

F I G. 5
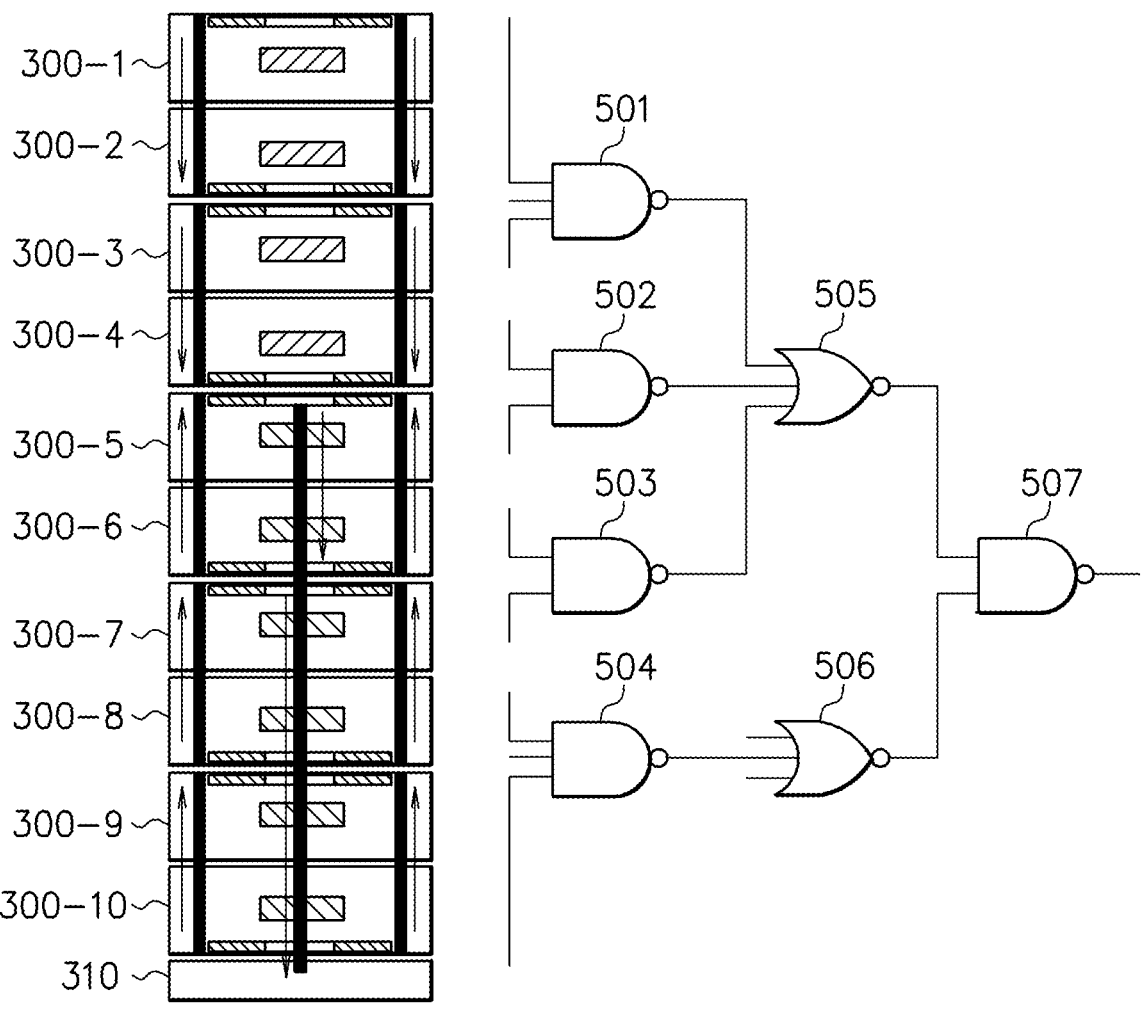

F I G. 6
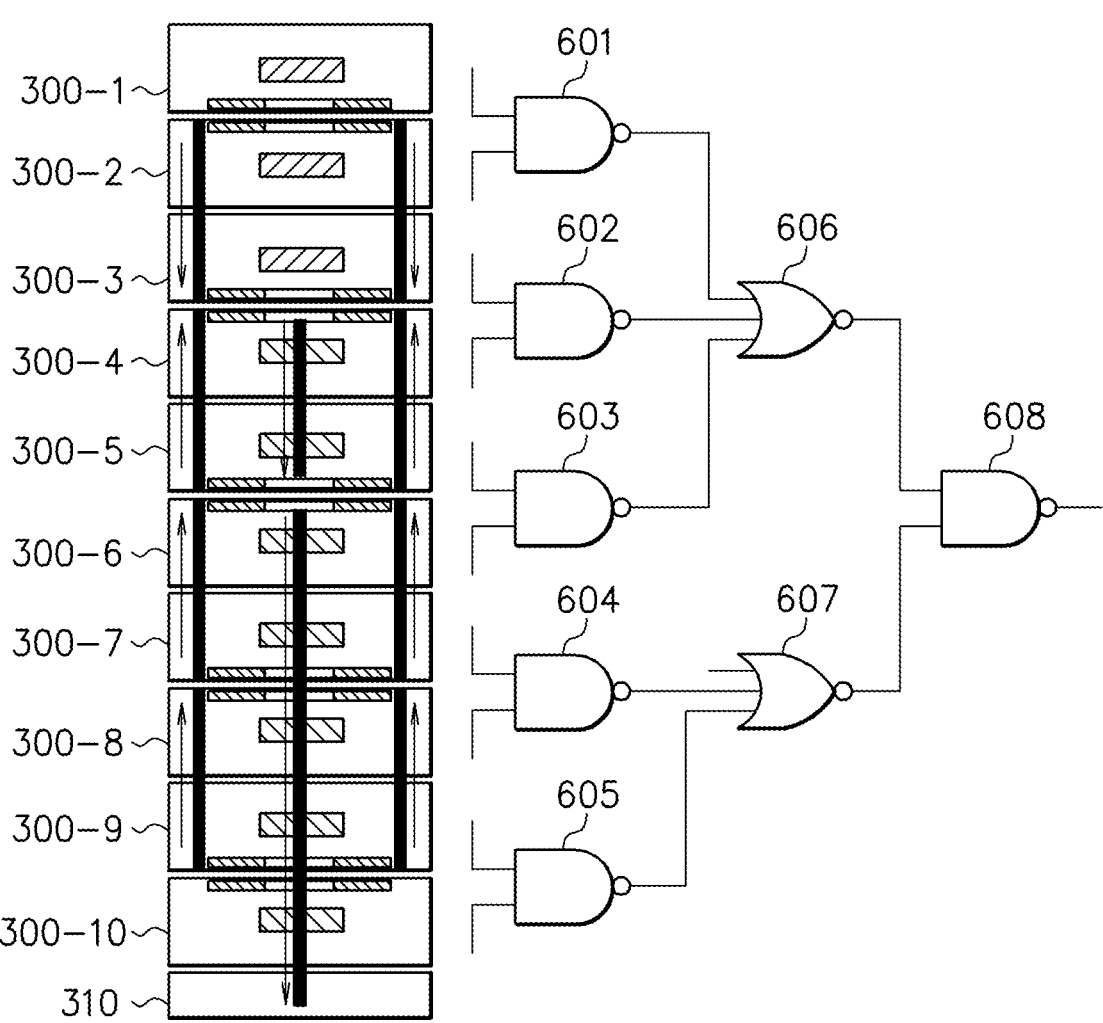

F I G. 7
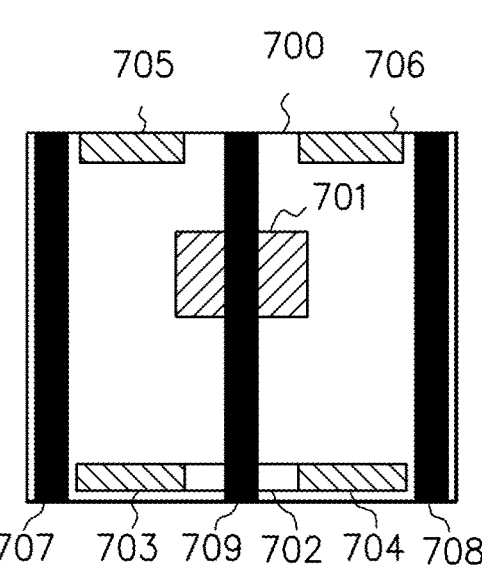
F I G. 8
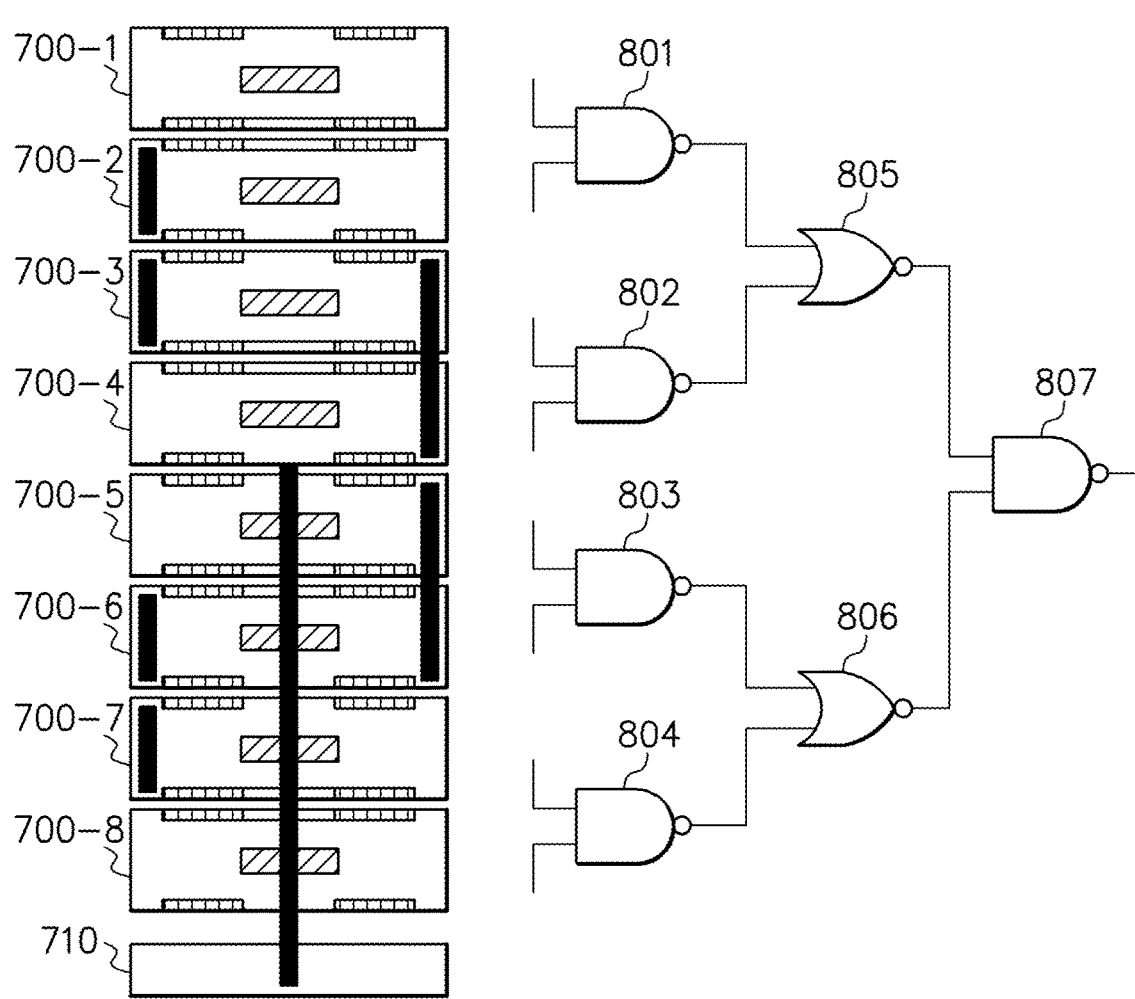

F I G. 9
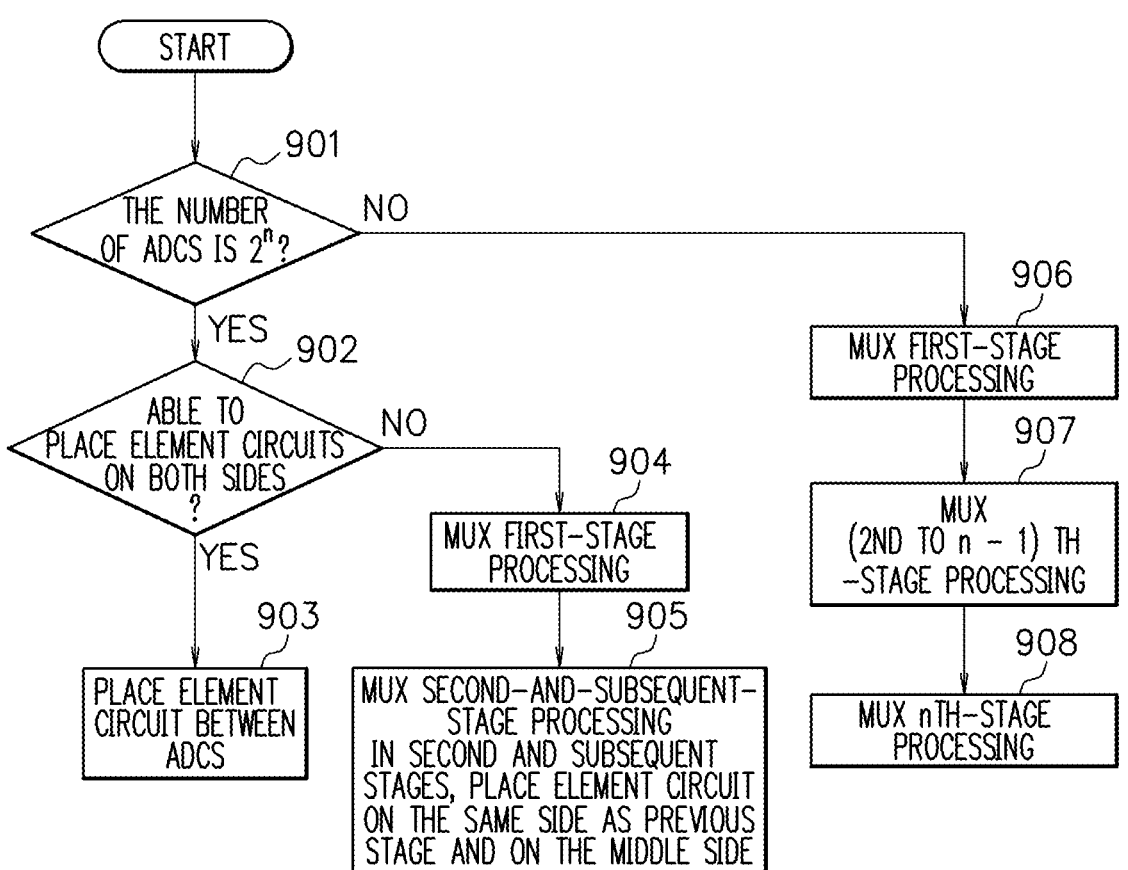

F I G. 10A
N=6
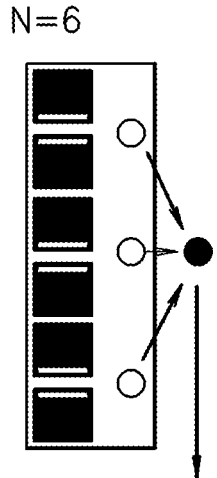
F I G. 10B
N=10
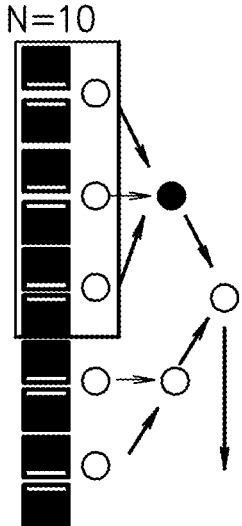

F I G. 10C
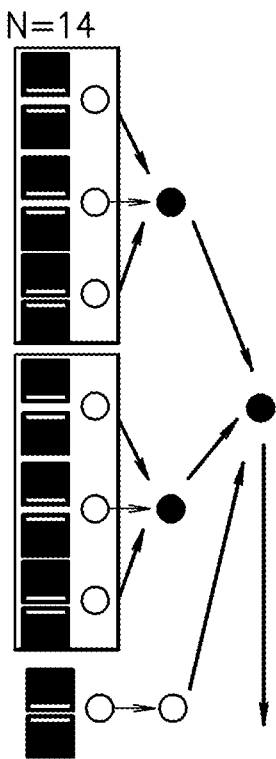
F I G. 10D
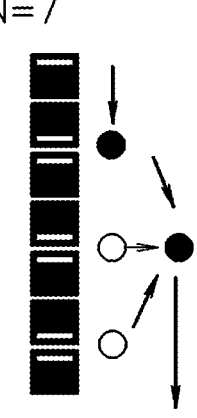

F I G. 10E
N=9
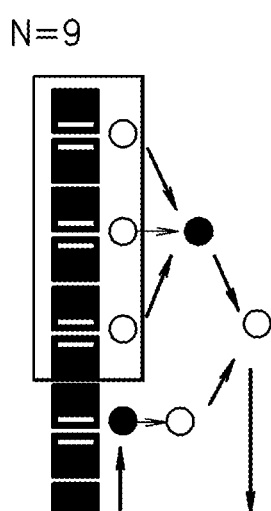
F I G. 10F
N=8
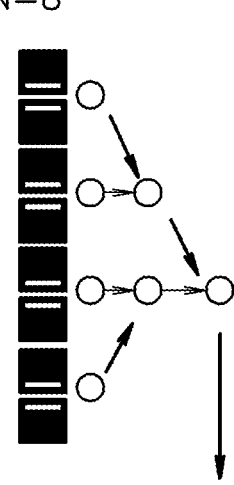

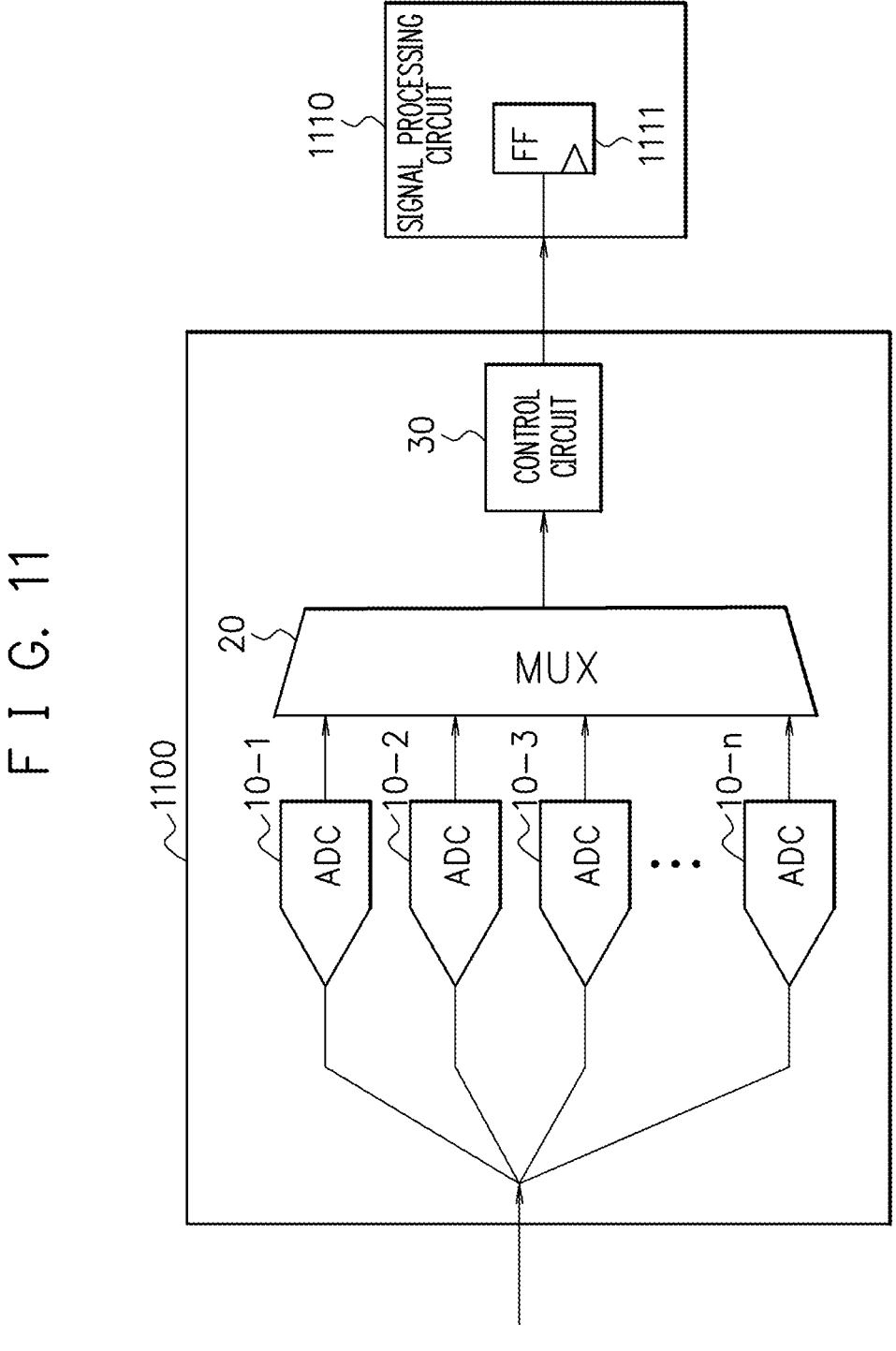
F I G. 11

F I G. 12A
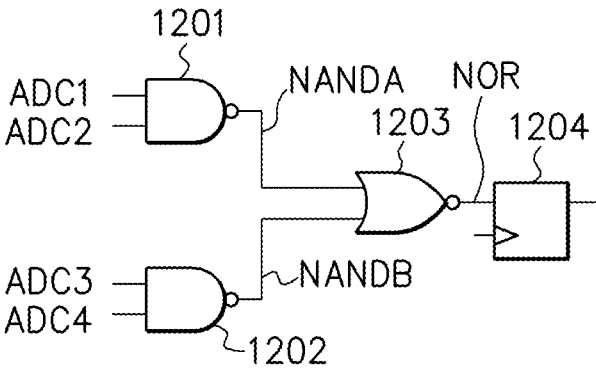
F I G. 12B
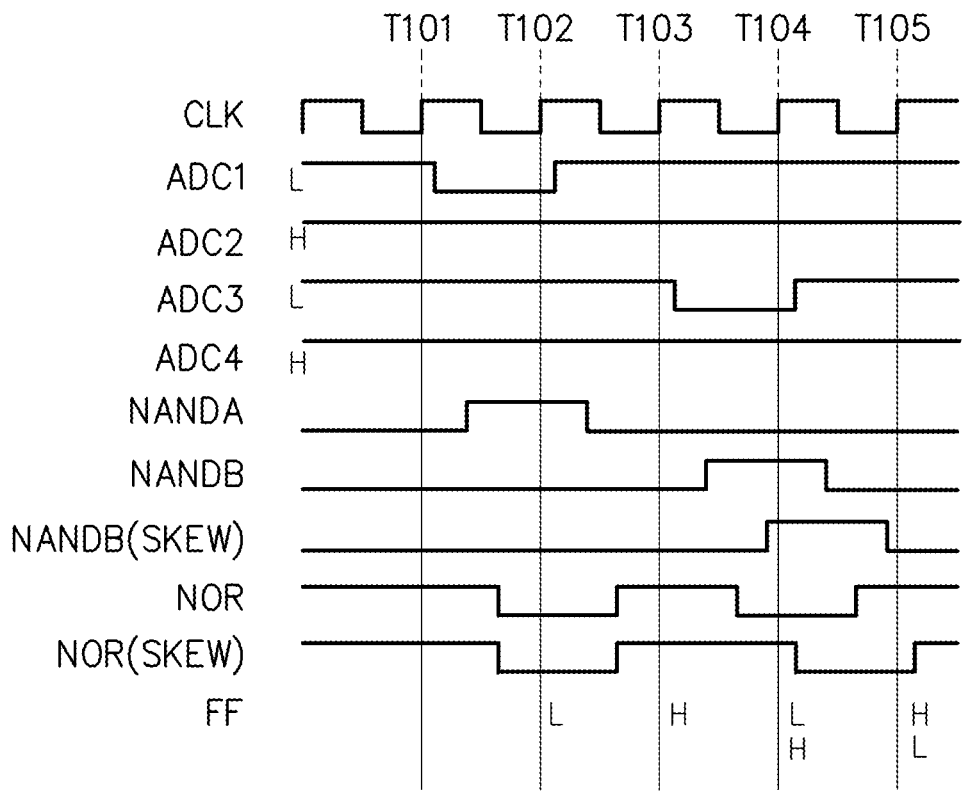

AD CONVERTER DEVICE, SEMICONDUCTOR INTEGRATED CIRCUIT DEVICE, AND DESIGNING METHOD OF AD CONVERTER DEVICE

CROSS-REFERENCE TO RELATED APPLICATION

This application is a continuation application of International Application PCT/JP2021/028278 filed on Jul. 30, 2021, and designated the U.S., the entire contents of which are incorporated herein by reference.

FIELD

The embodiments discussed herein are directed to an AD converter device, a semiconductor integrated circuit device, and a designing method of an AD converter device.

BACKGROUND

A time-interleaved analog-to-digital (AD) converter device using a plurality of AD converter circuit units that convert analog signals to digital signals includes a data bus circuit that integrates outputs of a plurality of the AD converter circuit units in a multiplexer circuit and outputs the integrated result. When a plurality of the AD converter circuit units are placed along one direction (placed vertically), skew occurs in the data bus circuit according to the position where the AD converter circuit unit is placed.

The data bus circuit using four AD converter circuit units is configured as illustrated in FIG. 12A, for example. The function as the multiplexer circuit is fabricated by negative logical product operation circuits (NAND circuits) 1201 and 1202 and a negative logical sum operation circuit (NOR circuit) 1203. An output signal ADC1 of the first AD converter circuit unit and an output signal ADC2 of the second AD converter circuit unit are input to the NAND circuit 1201, and an output signal ADC3 of the third AD converter circuit unit and an output signal ADC4 of the fourth AD converter circuit unit are input to the NAND circuit 1202. An output signal NANDA of the NAND circuit 1201 and an output signal NANDB of the NAND circuit 1202 are input to the NOR circuit 1203. An output signal NOR of the NOR circuit 1203 is input to a flip-flop circuit 1204.

As illustrated in FIG. 12B as one example, it is assumed that to the data bus circuit illustrated in FIG. 12A, during a first period from a time T101 to a time T102, the conversion result in the first AD converter circuit unit is input, and during a second period from the time T102 to a time T103, the conversion result in the second AD converter circuit unit is input. Further, it is assumed that to the data bus circuit illustrated in FIG. 12A, during a third period from the time T103 to a time T104, the conversion result in the third AD converter circuit unit is input, and during a fourth period from the time T104 to a time T105, the conversion result in the fourth AD converter circuit unit is input. Incidentally, it is assumed that the outputs ADC1 to ADC4 from the respective AD converter circuit units are fixed at a high level when not in a corresponding period.

When no skew occurs between the output signals of the respective AD converter circuit units in the data bus circuit, to thus cause no difference in transmission delay until the output signals reach the NAND circuits 1201 and 1202, AD-converted digital signals are transmitted as illustrated by the signals NANDA, NANDB, and NOR in FIG. 12B. In this case, as illustrated by a signal FF, in the flip-flop circuit 1204, signals at correct levels (L, H, L, H) corresponding to the levels (L, H, L, H) of the four output signals ADC1 to ADC4 are held. On the other hand, when skew occurs between the output signals of the respective AD converter circuit units, a difference in transmission delay until the output signals reach the NAND circuits 1201 and 1202 occurs, and as illustrated by signals NANDB (SKEW) and NOR (SKEW) in FIG. 12B, for example, skew occurs and the AD-converted digital signals are erroneously transmitted in some cases. In this case, as illustrated by the signal FF, in the flip-flop circuit 1204, signals at incorrect levels (L, H, H, L) that do not correspond to the levels (L, H, L, H) of the four output signals ADC1 to ADC4 are held. In order to prevent the digital signals from being erroneously transmitted due to the occurrence of skew, there has been disclosed in Patent Document 1 the technique that adjusts the skew by providing a variable delay circuit for the output of the AD converter circuit unit.

[Patent Document 1] U.S. Pat. No. 7,250,885

SUMMARY

One aspect of the AD converter device includes: a plurality of AD converter circuit units configured to perform analog-to-digital conversion in a time-interleaved manner; and a multiplexer circuit configured to generate a digital signal from output signals of the plurality of AD converter circuit units. The multiplexer circuit is a circuit in which with a plurality of logic circuits and a plurality of intermediate connection wirings that are placed to be distributed in the plurality of AD converter circuit units, the plurality of logic circuits are connected in a tournament configuration. In each of the AD converter circuit units, an output circuit and a first element circuit part including the logic circuit are placed along a first outer periphery and the intermediate connection wirings are placed to cross in a first direction. The plurality of AD converter circuit units are placed along the first direction with two adjacent ones of the AD converter circuit units set as a pair and with the output circuits and the first element circuit parts in the AD converter circuit units facing each other for each pair.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of an AD converter device in this embodiment;

FIG. 2A is a diagram illustrating a configuration example of a data bus circuit;

FIG. 2B is a timing chart explaining the operation of the data bus circuit;

FIG. 3 is a view explaining a first AD converter circuit unit;

FIG. 4A is a view explaining a placement example of the first AD converter circuit unit;

FIG. 4B is a view explaining the placement example of the first AD converter circuit unit;

FIG. 5 is a diagram explaining a reference example of the AD converter device;

FIG. 6 is a diagram explaining a first example of the AD converter device;

FIG. 7 is a view explaining a second AD converter circuit unit;

FIG. 8 is a diagram explaining a second example of the AD converter device;

FIG. 9 is a view explaining a designing method of the AD converter device in this embodiment;

FIG. 10A is a view explaining a placement example of logic circuits included in a multiplexer circuit;

FIG. 10B is a view explaining the placement example of the logic circuits included in the multiplexer circuit;

FIG. 10C is a view explaining the placement example of the logic circuits included in the multiplexer circuit;

FIG. 10D is a view explaining the placement example of the logic circuits included in the multiplexer circuit;

FIG. 10E is a view explaining the placement example of the logic circuits included in the multiplexer circuit;

FIG. 10F is a view explaining the placement example of the logic circuits included in the multiplexer circuit;

FIG. 11 is a diagram illustrating a configuration example of a semiconductor integrated circuit device in this embodiment;

FIG. 12A is a diagram illustrating an example of the data bus circuit; and

FIG. 12B is a timing chart explaining the operation of the data bus circuit illustrated in FIG. 12A.

DESCRIPTION OF EMBODIMENTS

There will be explained embodiments below based on the drawings.

FIG. 1 is a diagram illustrating a configuration example of an analog-to-digital (AD) converter device in this embodiment. The AD converter device in this embodiment includes a plurality of AD converter circuit units 10-$i$, a multiplexer circuit 20, and a control circuit 30. Incidentally, i is a subscript, and i is an integer from 1 to n (n is arbitrary).

Each of the AD converter circuit units 10-$i$ includes an AD converter circuit and performs AD conversion processing on an input analog signal to convert it to a digital signal. A plurality of the AD converter circuit units 10-$i$ included in the AD converter device perform AD conversion in a time-interleaved manner. The number of AD converter circuit units 10-$i$ and the number of bits related to AD conversion are determined according to the specifications or the like necessary for the AD converter device, which are not particularly limited. The method of AD conversion processing in the AD converter circuit unit 10-$i$ is not particularly limited, and any AD conversion processing method can be applied.

The multiplexer circuit 20 integrates output signals of a plurality of the AD converter circuit units 10-$i$ and generates a digital signal to be output. The multiplexer circuit 20 generates a digital signal by selectively outputting the output signals of a plurality of the AD converter circuit units 10-$i$ that perform AD conversion in a time-interleaved manner. The multiplexer circuit 20 is placed for each bit in the output signal of the AD converter circuit unit 10-$i$. The multiplexer circuit 20 includes a plurality of logic circuits, and these logic circuits are connected in a tournament configuration by a plurality of intermediate connection wirings. In this embodiment, there is employed, as one example, a circuit in which a plurality of logic circuits, such as one or more negative logical product operation circuits (NAND circuits) and one or more negative logical sum operation circuits (NOR circuits), are connected in a tournament configuration.

The control circuit 30 outputs the digital signal generated by the multiplexer circuit 20 to a digital signal processing circuit or the like.

FIG. 2A is a diagram illustrating a configuration example of a data bus circuit. The data bus circuit includes the multiplexer circuit 20 illustrated in FIG. 1, integrates the outputs of a plurality of the AD converter circuit units 10-$i$, and outputs a resultant digital signal. The data bus circuit includes an inverter 200, NAND circuits 210, 231, 232, 233, 234, 235, and 238, flip-flop circuits 220, 240, and 250, and NOR circuits 236 and 237. FIG. 2A illustrates a configuration example of the case where AD conversion is performed in a time-interleaved manner using the ten AD converter circuit units 10-$i$. The data bus circuit illustrated in FIG. 2A is configured using standard cells, for example.

The inverter 200 receives an output signal SIN of the corresponding one AD converter circuit unit 10-$i$ out of the ten AD converter circuit units 10-$i$. The NAND circuit 210 receives an output signal of the inverter 200 (an inverted signal of the signal SIN) and an enable signal EN. An output signal of the NAND circuit 210 is input to the flip-flop circuit 220. The enable signal EN is a signal for performing control to output the output signal SIN as the output signal of the NAND circuit 210 during the period when the output signal SIN of the corresponding AD converter circuit unit 10-$i$ is enabled, and to fix the output signal of the NAND circuit 210 at a high level during the period when the output signal SIN of the corresponding AD converter circuit unit 10-$i$ is disabled, in the AD conversion in a time-interleaved manner. The flip-flop circuit 220 takes in the output signal of the NAND circuit 210 using a clock signal CLK and outputs it as an output signal S11.

The inverter 200, the NAND circuit 210, and the flip-flop circuit 220, which are described above, are provided for each of the AD converter circuit units 10-$i$. That is, in this example, although not illustrated in the drawing, ten sets, one of which consists of the inverter 200, the NAND circuit 210, and the flip-flop circuit 220, are provided.

A multiplexer circuit 230 is configured by the NAND circuits 231, 232, 233, 234, 235, and 238 and the NOR circuits 236 and 237. The multiplexer circuit 230 is equivalent to the multiplexer circuit 20 illustrated in FIG. 1. The NAND circuits 231, 232, 233, 234, and 235, the NOR circuits 236 and 237, and the NAND circuit 238 are connected in a tournament configuration, where the NAND circuits 231, 232, 233, 234, and 235 are the first stage, the NOR circuits 236 and 237 are the second stage, and the NAND circuit 238 is the third stage.

The output signal of the flip-flop circuit 220 corresponding to the first AD converter circuit unit 10-1 and the output signal of the flip-flop circuit 220 corresponding to the second AD converter circuit unit 10-2 are input to the NAND circuit 231. The output signal of the flip-flop circuit 220 corresponding to the third AD converter circuit unit 10-3 and the output signal of the flip-flop circuit 220 corresponding to the fourth AD converter circuit unit 10-4 are input to the NAND circuit 232. The output signal of the flip-flop circuit 220 corresponding to the fifth AD converter circuit unit 10-5 and the output signal of the flip-flop circuit 220 corresponding to the sixth AD converter circuit unit 10-6 are input to the NAND circuit 233. The output signal of the flip-flop circuit 220 corresponding to the seventh AD converter circuit unit 10-7 and the output signal of the flip-flop circuit 220 corresponding to the eighth AD converter circuit unit 10-8 are input to the NAND circuit 234. The output signal of the flip-flop circuit 220 corresponding to the ninth AD converter circuit unit 10-9 and the output signal of the flip-flop circuit 220 corresponding to the tenth AD converter circuit unit 10-10 are input to the NAND circuit 235.

Output signals of the NAND circuits 231, 232, and 233 are input to the NOR circuit 236. Output signals of the NAND circuits 234 and 235 are input to the NOR circuit 237. Output signals of the NOR circuits 236 and 237 are input to the NAND circuit 238. An output signal S12 of the NAND circuit 238 is input to the flip-flop circuit 240.

As described previously, by the control with the enable signal EN, one AD converter circuit unit 10-i is exclusively enabled from among the ten AD converter circuit units 10-i, and the output signals of the flip-flop circuits 220 corresponding to the other AD converter circuit units 10-i are fixed at a high level. Therefore, the multiplexer circuit 230 outputs the output signal of the flip-flop circuit 220 corresponding to the enabled AD converter circuit unit 10-i, that is, the output signal of the enabled AD converter circuit unit 10-i, as the output signal S12.

The flip-flop circuit 240 takes in the output signal S12 of the multiplexer circuit 230 (output signal of the NAND circuit 238) using the clock signal CLK and outputs it as an output signal S13. The flip-flop circuit 250 takes in the output signal S13 of the flip-flop circuit 240 using the clock signal CLK and outputs it as an output signal SOUT.

FIG. 2B is a timing chart explaining the operation of the data bus circuit illustrated in FIG. 2A. At a time T11, the enable signal EN goes to a high level, and thereby, at a time T12, the output signal S11 (low level) corresponding to the output signal SIN (low level, here) of the corresponding AD converter circuit unit 10-i is output. Then, this output signal S11 is output as the output signal S12 (high level) through the multiplexer circuit 230. Thereafter, at a time T13 and a time T14, the output signal S12 is sequentially transmitted by the flip-flop circuits 240 and 250 and output as the output signal SOUT (high level). Although not illustrated in the drawing, the enable signal EN corresponding to each of the AD converter circuit units 10-i sequentially goes to a high level, and the output signal SIN of the corresponding AD converter circuit unit 10-i is output as the output signal S12 through the multiplexer circuit 230 and is finally output as the output signal SOUT.

FIG. 3 is a view explaining a first AD converter circuit unit 300. FIG. 3 illustrates a schematic configuration of a circuit layout of the first AD converter circuit unit. In FIG. 3, 301 denotes a control circuit that controls an AD converter circuit included in the first AD converter circuit unit 300 and outputs the result of AD conversion. Then, 302 denotes a driver circuit that receives the output (AD conversion result) of the control circuit 301 and outputs it. Then, 303 and 304 denote element circuit parts including logic circuits such as NAND circuits and NOR circuits, which are element circuits configuring a multiplexer circuit. In the first AD converter circuit unit 300, the driver circuit 302 and the element circuit parts 303 and 304 are placed along an outer periphery. The driver circuit 302 is an output circuit that receives the output of the control circuit 301 through wiring inside the first AD converter circuit unit 300 and outputs it through the NAND circuits and the NOR circuits placed in the right and left element circuit parts 303 and 304.

Incidentally, in the first AD converter circuit unit 300, the components other than these are circuit parts that perform AD conversion operations. Further, 305, 306, and 307 denote intermediate connection wirings connecting between the first AD converter circuit units 300, and are placed in the middle and at both ends of the first AD converter circuit unit 300 to cross the first AD converter circuit unit 300. In this example, the intermediate connection wirings 305 and 306 are data wirings for the number of bits, which is half the number of bits related to AD conversion, and the intermediate connection wiring 307 is data wiring for the number of bits related to AD conversion. In this embodiment, with the element circuit parts 303 and 304 and the intermediate connection wirings 305, 306, and 307, the element circuits (logic circuits) configuring the multiplexer circuit and the intermediate connection wirings are placed to be distributed in the first AD converter circuit units 300.

In this embodiment, in the case where the AD converter device is configured using the first AD converter circuit unit 300, as illustrated in FIG. 4A, the two first AD converter circuit units 300 are placed with the output circuits (driver circuits 302) and the element circuit parts 303 and 304 of the first AD converter circuit units 300 facing each other. This placement eliminates the need for intermediate connection wiring to transmit the AD conversion result from one first AD converter circuit unit 300 to the other first AD converter circuit unit 300, compared to the placement illustrated in FIG. 4B, and makes it possible to inhibit the skew to occur between the output signals of the first AD converter circuit units 300.

For example, in the case where ten first AD converter circuit units 300-1 to 300-10 are placed along one direction (stacked vertically), as illustrated in FIG. 5, when such a pair of the first AD converter circuit units 300 as illustrated in FIG. 4B is placed along one direction (the direction in which the intermediate connection wirings 305, 306, and 307 extend), the difference between the longest path and the shortest path until the AD conversion result is transmitted to a relay flip-flop 310 increases, and the skew due to this difference in transmission delay occurs.

FIG. 5 is a diagram explaining a reference example of the AD converter device. In the configuration illustrated in FIG. 5, output signals of the first AD converter circuit units 300-1, 300-2, and 300-3 are input to an NAND circuit 501. Output signals of the first AD converter circuit units 300-4 and 300-5 are input to an NAND circuit 502. Output signals of the first AD converter circuit units 300-6 and 300-7 are input to an NAND circuit 503. Output signals of the first AD converter circuit units 300-8, 300-9, and 300-10 are input to an NAND circuit 504. Output signals of the NAND circuits 501, 502, and 503 are input to an NOR circuit 505. An output signal of the NAND circuit 504 is input to an NOR circuit 506. Output signals of the NOR circuits 505 and 506 are input to an NAND circuit 507, and an output signal of the NAND circuit 507 is input to the relay flip-flop 310.

The output signal of the first AD converter circuit unit 300-1 is input to the NAND circuit 501 through the intermediate connection wirings 305 and 306 of the first AD converter circuit units 300-1 and 300-2. The output signal of the first AD converter circuit unit 300-10 is input to the NAND circuit 504 through the intermediate connection wirings 305 and 306 of the first AD converter circuit units 300-9 and 300-10. The output signal of the NAND circuit 501 is input to the NOR circuit 505 through the intermediate connection wirings 305 and 306 of the first AD converter circuit units 300-3 and 300-4. The output signal of the NAND circuit 503 is input to the NOR circuit 505 through the intermediate connection wirings 305 and 306 of the first AD converter circuit units 300-5 and 300-6. The output signal of the NOR circuit 505 is input to the NAND circuit 507 through the intermediate connection wirings 307 of the first AD converter circuit units 300-5 and 300-6. The output signal of the NOR circuit 506 is input to the NAND circuit 507 through the intermediate connection wirings 305 and

306 of the first AD converter circuit units 300-7 and 300-8. The output signal of the NAND circuit 507 is input to the relay flip-flop 310 through the intermediate connection wirings 307 of the first AD converter circuit units 300-7, 300-8, 300-9, and 300-10.

Comparing the first AD converter circuit unit 300-1 whose transmission path for AD conversion results is the longest with the first AD converter circuit units 300-4, 300-5, 300-8, and 300-9 whose transmission path for AD conversion results is the shortest, there is a difference in wiring length for four first AD converter circuit units, and this difference in transmission delay results in skew.

In contrast to this, as illustrated in FIG. 6, when such a pair of the first AD converter circuit units 300 as illustrated in FIG. 4A is placed along one direction (the direction in which the intermediate connection wirings 305, 306, and 307 extend), the difference between the longest path and the shortest path until the AD conversion result is transmitted to the relay flip-flop 310 becomes smaller than that illustrated in FIG. 5, resulting in that the skew to occur can be inhibited. FIG. 6 is a diagram explaining a first example of the AD converter device.

In the configuration illustrated in FIG. 6, the output signals of the first AD converter circuit units 300-1 and 300-2 are input to an NAND circuit 601. The output signals of the first AD converter circuit units 300-3 and 300-4 are input to an NAND circuit 602. The output signals of the first AD converter circuit units 300-5 and 300-6 are input to an NAND circuit 603. The output signals of the first AD converter circuit units 300-7 and 300-8 are input to an NAND circuit 604. The output signals of the first AD converter circuit units 300-9 and 300-10 are input to an NAND circuit 605. Output signals of the NAND circuits 601, 602, and 603 are input to an NOR circuit 606. Output signals of the NAND circuits 604 and 605 are input to an NAND circuit 607. Output signals of the NOR circuits 606 and 607 are input to an NAND circuit 608, and an output signal of the NAND circuit 608 is input to the relay flip-flop 310.

The NAND circuit 601 is placed in the element circuit parts 303 and 304 between the first AD converter circuit units 300-1 and 300-2. The NAND circuit 602 is placed in the element circuit parts 303 and 304 between the first AD converter circuit units 300-3 and 300-4. The NAND circuit 603 is placed in the element circuit parts 303 and 304 between the first AD converter circuit units 300-5 and 300-6. The NAND circuit 604 is placed in the element circuit parts 303 and 304 between the first AD converter circuit units 300-7 and 300-8. The NAND circuit 605 is placed in the element circuit parts 303 and 304 between the first AD converter circuit units 300-9 and 300-10.

The NOR circuit 606 is placed in the element circuit parts 303 and 304 between the first AD converter circuit units 300-3 and 300-4. The NOR circuit 607 is placed in the element circuit parts 303 and 304 between the first AD converter circuit units 300-7 and 300-8. The NAND circuit 608 is placed in the element circuit parts 303 and 304 between the first AD converter circuit units 300-5 and 300-6.

The output signal of the NAND circuit 601 is input to the NOR circuit 606 through the intermediate connection wirings 305 and 306 of the first AD converter circuit units 300-2 and 300-3. The output signal of the NAND circuit 603 is input to the NOR circuit 606 through the intermediate connection wirings 305 and 306 of the first AD converter circuit units 300-4 and 300-5. The output signal of the NAND circuit 605 is input to the NOR circuit 607 through the intermediate connection wirings 305 and 306 of the first AD converter circuit units 300-8 and 300-9. The output signal of the NOR circuit 606 is input to the NAND circuit 608 through the intermediate connection wirings 307 of the first AD converter circuit units 300-4 and 300-5. The output signal of the NOR circuit 607 is input to the NAND circuit 608 through the intermediate connection wirings 305 and 306 of the first AD converter circuit units 300-6 and 300-7. The output signal of the NAND circuit 608 is input to the relay flip-flop 310 through the intermediate connection wirings 307 of the first AD converter circuit units 300-6, 300-7, 300-8, 300-9, and 300-10.

Therefore, comparing the first AD converter circuit units 300-1, 300-2, 300-5, 300-6, 300-9, and 300-10 whose transmission path for AD conversion results is the longest with the first AD converter circuit units 300-3, 300-4, 300-7, and 300-8 whose transmission path for AD conversion results is the shortest, the difference in wiring length is for two first AD converter circuit units, resulting in that the skew to occur can be inhibited.

FIG. 7 is a view explaining a second AD converter circuit unit 700. FIG. 7 illustrates a schematic configuration of a circuit layout of the second AD converter circuit unit. The second AD converter circuit unit 700 illustrated in FIG. 7 is applicable in the case where the AD converter device includes $2^n$ pieces of second AD converter circuit units. In FIG. 7, 701 denotes a control circuit that controls an AD converter circuit included in the second AD converter circuit unit 700 and outputs the result of AD conversion. Then, 702 denotes a driver circuit that receives the output of the control circuit 701 (AD conversion result) and outputs it. Then, 703, 704, 705, and 706 denote element circuit parts including logic circuits such as NAND circuits and NOR circuits, which are element circuits configuring a multiplexer circuit. In the second AD converter circuit unit 700, the driver circuit 702 and the element circuit parts 703 and 704 and the element circuit parts 705 and 706 are placed along an outer periphery. Further, of the second AD converter circuit unit 700, the output circuit (driver circuit 702) and the first element circuit parts 703 and 704, and the second element circuit parts 705 and 706, are placed to face inside the second AD converter circuit unit 700. The driver circuit 702 is an output circuit that receives the output of the control circuit 701 through wiring inside the second AD converter circuit unit 700 and outputs it through NAND circuits and NOR circuits placed in the element circuit parts 703, 704, 705, and 706. Incidentally, in the second AD converter circuit unit 700, the components other than these are circuit parts that perform AD conversion operations. Further, 707, 708, and 709 denote intermediate connection wirings connecting between the second AD converter circuit units 700, and are placed in the middle and at both ends of the second AD converter circuit unit 700 to cross the second AD converter circuit unit 700. In this example, the intermediate connection wirings 707, 708, and 709 each are data wiring for the number of bits related to AD conversion. In this embodiment, with the first element circuit parts 703 and 704, the second element circuit parts 705 and 706, and the intermediate connection wirings 707, 708, and 709, the element circuits (logic circuits) configuring the multiplexer circuit and the intermediate connection wirings are placed to be distributed in the second AD converter circuit units 700.

In the case where the AD converter device includes $2^n$ pieces of AD converter circuit units, the AD converter device is configured using the second AD converter circuit units 700, and thereby the path lengths can be made the same for any path. As illustrated in FIG. 8, there is explained, as an example, the case where eight second AD converter circuit units 700-1 to 700-8 are placed (stacked vertically) along one direction (the direction in which the intermediate connection wirings 707, 708, and 709 extend) with two adjacent second AD converter circuit units 700 set as a pair and the output circuits (driver circuits 702) and the first element circuit parts 703 and 704 of the second AD converter circuit units 700 facing each other for each pair. FIG. 8 is a diagram explaining a second example of the AD converter device.

In the configuration illustrated in FIG. 8, output signals of the second AD converter circuit units 700-1 to 700-2 are input to an NAND circuit 801. Output signals of the second AD converter circuit units 700-3 and 700-4 are input to an NAND circuit 802. Output signals of the second AD converter circuit units 700-5 and 700-6 are input to an NAND circuit 803. Output signals of the second AD converter circuit units 700-7 and 700-8 are input to an NAND circuit 804. Output signals of the NAND circuits 801 and 802 are input to an NOR circuit 805. Output signals of the NAND circuits 803 and 804 are input to an NOR circuit 806. Output signals of the NOR circuits 805 and 806 are input to an NOR circuit 807, and an output signal of the NAND circuit 807 is input to a relay flip-flop 710.

The NAND circuit 801 is placed in the first element circuit parts 703 and 704 between the second AD converter circuit units 700-1 and 700-2. The NAND circuit 802 is placed in the first element circuit parts 703 and 704 between the second AD converter circuit units 700-3 and 700-4. The NAND circuit 803 is placed in the first element circuit parts 703 and 704 between the second AD converter circuit units 700-5 and 700-6. The NAND circuit 804 is placed in the first element circuit parts 703 and 704 between the second AD converter circuit units 700-7 and 700-8.

The NOR circuit 805 is placed in the second element circuit parts 705 and 706 between the second AD converter circuit units 700-2 and 700-3. The NOR circuit 806 is placed in the second element circuit parts 705 and 706 between the second AD converter circuit units 700-6 and 700-7. The NAND circuit 807 is placed in the second element circuit parts 705 and 706 between the second AD converter circuit units 700-4 and 700-5.

The output signal of the NAND circuit 801 is input to the NOR circuit 805 through the intermediate connection wiring 708 of the second AD converter circuit unit 700-2. The output signal of the NAND circuit 802 is input to the NOR circuit 805 through the intermediate connection wiring 707 of the second AD converter circuit unit 700-3. The output signal of the NAND circuit 803 is input to the NOR circuit 806 through the intermediate connection wiring 708 of the second AD converter circuit unit 700-6. The output signal of the NAND circuit 804 is input to the NOR circuit 806 through the intermediate connection wiring 707 of the second AD converter circuit unit 700-7. The output signal of the NOR circuit 805 is input to the NAND circuit 807 through the intermediate connection wiring 708 of the second AD converter circuit unit 700-3 and the intermediate connection wiring 707 of the second AD converter circuit unit 700-4. The output signal of the NOR circuit 806 is input to the NAND circuit 807 through the intermediate connection wiring 707 of the second AD converter circuit unit 700-6 and the intermediate connection wiring 708 of the second AD converter circuit unit 700-5. The output signal of the NAND circuit 807 is input to the relay flip-flop 710 through the intermediate connection wirings 709 of the second AD converter circuit units 700-5, 700-6, 700-7, and 700-8.

With this configuration, the path length of any path from the second AD converter circuit units 700-1 to 700-8 to the NAND circuit 807 results in the wiring length for three second AD converter circuit units, and there is no difference in wiring length, to thus cause no difference in transmission delay among the paths, resulting in that the skew to occur can be inhibited.

FIG. 9 is a view explaining a designing method of the AD converter device in this embodiment.

The designing method of the AD converter device in this embodiment can be implemented by a computer (designing device), for example, and each processing of the designing method of the AD converter device in this embodiment is executed by its processor (CPU, and so on).

At Step 901, the processor determines whether or not the number of AD converter circuit units included in the AD converter device is 2n. When determining that the number of AD converter circuit units included in the AD converter device is 2" (YES at Step 901), at Step 902, the processor determines whether or not to be able to place the element circuits (logic circuits such as NAND circuits and NOR circuits) configuring the multiplexer circuit on both sides in the AD converter circuit unit, that is, whether or not to be able to place the second AD converter circuit unit 700.

When determining that the processor is able to place the element circuits on both sides in the AD converter circuit unit (YES at Step 902), at Step 903, the processor, as illustrated in FIG. 8 as one example, places (vertically stacks) a plurality of the second AD converter circuit units 700 along one direction (the direction in which the intermediate connection wirings 707, 708, and 709 extend) with two adjacent second AD converter circuit units 700 set as a pair and the output circuits (driver circuits 702) and the first element circuit parts 703 and 704 of the second AD converter circuit units 700 facing each other for each pair. And the processor, regardless of pair, places the logic circuit configuring the multiplexer circuit in all the element circuit parts (first element circuit parts 703 and 704 and second element circuit parts 705 and 706) between the adjacent second AD converter circuit units 700.

On the other hand, when determining that the processor is unable to place the element circuits on both sides in the AD converter circuit unit (NO at Step 902), at Step 904, the processor, as illustrated in FIG. 10F as one example below, performs placement processing of the first-stage logic circuits in the multiplexer circuit (MUX first-stage processing). In this placement processing at Step 904, the processor places (vertically stacks) a plurality of the first AD converter circuit units 300 along one direction (the direction in which the intermediate connection wirings 305, 306, and 307 extend) with two adjacent first AD converter circuit units 300 set as a pair and the output circuits (driver circuits 302) and the element circuit parts 303 and 304 of the first AD converter circuit units 300 facing each other for each pair. And the processor places the logic circuit (NAND circuit) configuring the multiplexer circuit in the element circuit parts 303 and 304 between the two adjacent first AD converter circuit units 300 for each pair. Then, at Step 905, the processor performs placement processing of the logic circuits in the second and subsequent stages in the multiplexer circuit (MUX second-and-subsequent-stage processing). In this placement processing at Step 905, the processor sets two adjacent logic circuits in the previous stage as a pair and places the logic circuit configuring the multiplexer circuit in the element circuit parts 303 and 304 at the same position as, of the paired logic circuits, the logic circuit on the side closer to the middle of the first AD converter circuit units placed along one direction (stacked vertically). This placement processing is performed repeatedly until the number of logic circuits present in one stage becomes one.

When determining that the number of AD converter circuit units included in the AD converter device is not $2^n$ (NO at Step 901), at Step 906, the processor performs placement processing of the first-stage logic circuits in the multiplexer circuit (MUX first-stage processing). In this placement processing at Step 906, the processor places (vertically stacks) a plurality of the first AD converter circuit units 300 along one direction (the direction in which the intermediate connection wirings 305, 306, and 307 extend) with two adjacent first AD converter circuit units 300 set as a pair and the output circuits (driver circuits 302) and the element circuit parts 303 and 304 of the first AD converter circuit units 300 facing each other for each pair. In this placement processing, when the number of AD converter circuit units included in the AD converter device is an even number, the processor places the logic circuit configuring the multiplexer circuit in the element circuit parts 303 and 304 between the two adjacent first AD converter circuit units 300 for each pair, as illustrated in FIG. 10A, FIG. 10B, and FIG. 10C below as one example. In this placement processing, when the number of AD converter circuit units included in the AD converter device is an odd number, as illustrated in FIG. 10D and FIG. 10E below as one example, at one end including the first AD converter circuit unit 300 in which the output circuit (driver circuit 302) and the element circuit parts 303 and 304 are placed without facing another output circuit or element circuit parts, the processor sets three adjacent first AD converter circuit units 300 as a set, places the logic circuit configuring the multiplexer circuit in the element circuit parts 303 and 304 on the side closer to the middle of the AD converter circuit units placed along one direction (stacked vertically), and regarding the remaining AD converter circuit units 300, places the logic circuit configuring the multiplexer circuit in the element circuit parts 303 and 304 between the two first AD converter circuit units 300 for each pair of the two adjacent first AD converter circuit units 300.

Then, at Step 907, the processor performs placement processing of the logic circuits in the second stage to the (n-1) th stage before the final stage in the multiplexer circuit (MUX (2nd to n-1) th-stage processing). In this placement processing at Step 907, the processor divides the number of logic circuits in the previous stage by three, as illustrated in FIG. 10B, FIG. 10C, and FIG. 10E below as one example, provides as many sets of three logic circuits as the quotient from one side, and places the logic circuit configuring the multiplexer circuit in the element circuit parts 303 and 304 at the same position as the logic circuit located in the middle of each set. In the case where the number of remaining logic circuits is two, as illustrated in FIG. 10B below as one example, the processor places the logic circuit configuring the multiplexer circuit in the element circuit parts 303 and 304 at the same position as, of the two remaining logic circuits, the logic circuit on the side closer to the middle of the AD converter circuit units placed along one direction (stacked vertically). Further, in the case where the number of remaining logic circuits is one, as illustrated in FIG. 10C and FIG. 10E below as one example, the processor places the logic circuit configuring the multiplexer circuit in the element circuit parts 303 and 304 at the same position as the remaining one logic circuit. This placement processing is performed repeatedly until the number of logic circuits present in one stage becomes two or three.

Incidentally, as illustrated in FIG. 10A and FIG. 10D below as one example, in the case where the number of logic circuits present in one stage is already two or three at the time when Step 906 is completed (when Step 907 is started), the processor proceeds to Step 908 without performing the placement processing at Step 907.

Then, at Step 908, the processor performs placement processing of the logic circuits at the nth stage, which is the final stage, in the multiplexer circuit (MUX nth-stage processing). In this placement processing at Step 908, in the case where the number of logic circuits in the previous stage is two, as illustrated in FIG. 10B and FIG. 10E below as one example, the processor places the logic circuit configuring the multiplexer circuit in the element circuit parts 303 and 304 between the two logic circuits. Further, in the case where the number of logic circuits in the previous stage is three, as illustrated in FIG. 10A, FIG. 10C, and FIG. 10D below as one example, the processor places the logic circuit configuring the multiplexer circuit in the element circuit parts 303 and 304 on the side closer to the middle of the AD converter circuit units placed along one direction (stacked vertically).

The above is pieces of the processing of the designing method of the AD converter device in this embodiment.

FIG. 10A to FIG. 10F illustrate placement examples of the logic circuit in the multiplexer circuit in the AD converter device designed as described previously. In FIG. 10A to FIG. 10F, "O" indicates a two-input logic circuit (NAND circuit or NOR circuit), and "•" indicates a three-input logic circuit (NAND circuit or NOR circuit). FIG. 10A to FIG. 10C each illustrate an example in which the number of AD converter circuit units included in the AD converter device is not $2^n$ but an even number. FIG. 10A illustrates the example in which the number of AD converter circuit units is six, FIG. 10B illustrates the example in which the number of AD converter circuit units is ten, and FIG. 10C illustrates the example in which the number of AD converter circuit units is fourteen. FIG. 10D to FIG. 10E each illustrate an example in which the number of AD converter circuit units included in the AD converter device is not $2^n$ but an odd number. FIG. 10D illustrates the example in which the number of AD converter circuit units is seven, and FIG. 10E illustrates the example in which the number of AD converter circuit units is nine. FIG. 10F indicates an example in which the number of AD converter circuit units included in the AD converter device is $2^n$, but the element circuit is unable to be placed on both sides in the AD converter circuit unit, and the number of AD converter circuit units is eight.

As explained above, according to this embodiment, in the AD converter device that performs AD conversion in a time-interleaved manner using a plurality of the AD converter circuits, it is possible to inhibit the skew to occur between the output signals of a plurality of the AD converter circuit units without adding circuits.

Another Embodiment

FIG. 11 is a diagram illustrating a configuration example of a semiconductor integrated circuit device in this embodiment. In FIG. 11, components having the same functions as those illustrated in FIG. 1 are denoted by the same reference numerals and symbols, and redundant explanations are omitted. The semiconductor integrated circuit device in this embodiment includes an AD converter device 1100 that performs AD conversion in a time-interleaved manner, and a signal processing circuit 1110 such as a logic circuit that receives a digital signal from the AD converter device 1100 and performs a processing operation. The AD converter device 1100 performs AD conversion processing on input analog signals and outputs a resultant digital signal. The digital signal output from the AD converter device 1100 is taken in the signal processing circuit 1110 by a flip-flop circuit 1111, and digital signal processing or the like is performed in the signal processing circuit 1110.

Further, the above embodiments merely illustrate concrete examples of implementing the present invention, and the technical scope of the present invention is not to be construed in a restrictive manner by the embodiments. That is, the present invention may be implemented in various forms without departing from the technical spirit or main features thereof.

The disclosed AD converter device can inhibit the skew to occur between output signals of a plurality of AD converter circuit units that perform AD conversion in a time-interleaved manner without adding circuits.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An AD converter device, comprising:

a plurality of AD converter circuit units, each of which includes an AD converter circuit and an output circuit, the AD converter circuit being configured to perform analog-to-digital conversion in a time-interleaved manner, and the output circuit being configured to output a result of AD conversion by the AD converter circuit as an output signal; and a multiplexer circuit configured to generate a digital signal from output signals of the plurality of AD converter circuit units, the multiplexer circuit being a circuit in which a plurality of logic circuits are connected in a tournament configuration using a plurality of intermediate connection wirings, wherein in a circuit layout of the AD converter device, the plurality of logic circuits and the plurality of intermediate connection wirings are placed to be distributed in the plurality of AD converter circuit units, in each of the plurality of AD converter circuit units, the output circuit and a first element circuit part including at least one of the plurality of logic circuits are placed along a first outer periphery and the intermediate connection wirings are placed to cross in a first direction, and the plurality of AD converter circuit units are placed along the first direction with two adjacent ones of the plurality of AD converter circuit units set as a pair and with the output circuits and the first element circuit parts included in the plurality of AD converter circuit units facing each other for each pair.

2. The AD converter device according to claim 1, wherein the multiplexer circuit is configured by connecting the plurality of logic circuits included in the first element circuit parts of the plurality of AD converter circuit units by the plurality of intermediate connection wirings in the plurality of AD converter circuit units.

3. The AD converter device according to claim 1, wherein in each of the plurality of AD converter circuit units, the plurality of intermediate connection wirings are placed in the middle and at both ends of the AD converter circuit unit to cross in the first direction.

4. The AD converter device according to claim 3, wherein the plurality of intermediate connection wirings placed at the both ends of the AD converter circuit unit are data wirings corresponding to half of the number of bits on AD conversion in the AD converter circuit unit, and the plurality of intermediate connection wirings placed in the middle of the AD converter circuit unit are data wirings corresponding to the number of bits on AD conversion in the AD converter circuit unit.

5. The AD converter device according to claim 1, wherein in each of the plurality of AD converter circuit units, a second element circuit part including the logic circuit is placed along a second outer periphery facing the first outer periphery along which the output circuit and the first element circuit part are placed, the second element circuit part being different from the first element circuit part.

6. The AD converter device according to claim 5, wherein the multiplexer circuit is configured by connecting the plurality of logic circuits included in the first element circuit parts and the second element circuit parts of the plurality of AD converter circuit units by the plurality of intermediate connection wirings in the plurality of AD converter circuit units.

7. The AD converter device according to claim 5, wherein in each of the plurality of AD converter circuit units, the plurality of intermediate connection wirings are placed in the middle and at both ends of the AD converter circuit unit to cross in the first direction.

8. The AD converter device according to claim 7, wherein the plurality of intermediate connection wirings placed at the both ends of the AD converter circuit unit are data wiring corresponding to the number of bits on AD conversion in the AD converter circuit unit, and the plurality of intermediate connection wirings placed in the middle of the AD converter circuit unit are data wiring corresponding to the number of bits on AD conversion in the AD converter circuit unit.

9. The AD converter device according to claim 1, wherein the plurality of logic circuits which constitute the multiplexer circuit are one or more negative logical product operation circuits and one or more negative logical sum operation circuits.

10. A semiconductor integrated circuit device, comprising:

an AD converter device configured to perform analog-to-digital conversion in a time-interleaved manner; and a signal processing circuit configured to receive a digital signal from the AD converter device to perform a processing operation, wherein the AD converter device includes:

a plurality of AD converter circuit units including an AD converter circuit and an output circuit, respectively, the AD converter circuit being configured to perform analog-to-digital conversion, and the output circuit being configured to output the result of AD conversion by the AD converter circuit as an output signal; and a multiplexer circuit configured to generate a digital signal from output signals of the plurality of AD converter circuit units, the multiplexer circuit being a circuit in which a plurality of logic circuits are connected in a tournament configuration using a plurality of intermediate connection wirings, in a circuit layout of the AD converter device, the plurality of logic circuits and the plurality of intermediate connection wirings are placed to be distributed in the plurality of AD converter circuit units, in each of the plurality of AD converter circuit units, the output circuit and a first element circuit part including at least one of the plurality of logic circuits are placed along a first outer periphery and the plurality of intermediate connection wirings are placed to cross in a first direction, and the plurality of AD converter circuit units are placed along the first direction with two adjacent ones of the plurality of AD converter circuit units set as a pair and with the output circuits and the first element circuit parts included in the plurality of AD converter circuit units facing each other for each pair.

11. The semiconductor integrated circuit device according to claim 10, wherein the multiplexer circuit is configured by connecting the plurality of logic circuits included in the first element circuit parts of the plurality of AD converter circuit units by the plurality of intermediate connection wirings in the plurality of AD converter circuit units.

12. The semiconductor integrated circuit device according to claim 10, wherein in each of the plurality of AD converter circuit units, the plurality of intermediate connection wirings are placed in the middle and at both ends of the AD converter circuit unit to cross in the first direction.

13. The semiconductor integrated circuit device according to claim 12, wherein the plurality of intermediate connection wirings placed at the both ends of the AD converter circuit unit are data wirings corresponding to half of the number of bits on AD conversion in the AD converter circuit unit, and the plurality of intermediate connection wirings placed in the middle of the AD converter circuit unit are data wirings corresponding to the number of bits on AD conversion in the AD converter circuit unit.

14. The semiconductor integrated circuit device according to claim 10, wherein in each of the plurality of AD converter circuit units, a second element circuit part including the logic circuit is placed along a second outer periphery facing the first outer periphery along which the output circuit and the first element circuit part are placed, the second element circuit part being different from the first element circuit part.

15. The semiconductor integrated circuit device according to claim 14, wherein the multiplexer circuit is configured by connecting the plurality of logic circuits included in the first element circuit parts and the second element circuit parts of the plurality of AD converter circuit units by the plurality of intermediate connection wirings in the plurality of AD converter circuit units.

16. The semiconductor integrated circuit device according to claim 14, wherein in each of the plurality of AD converter circuit units, the plurality of intermediate connection wirings are placed in the middle and at both ends of the AD converter circuit unit to cross in the first direction.

17. The semiconductor integrated circuit device according to claim 16, wherein the plurality of intermediate connection wirings placed at the both ends of the AD converter circuit unit are data wiring corresponding to the number of bits on AD conversion in the AD converter circuit unit, and the plurality of intermediate connection wirings placed in the middle of the AD converter circuit unit are data wiring corresponding to the number of bits on AD conversion in the AD converter circuit unit.

18. A designing method of an AD converter device, the AD converter device including: a plurality of AD converter circuit units including an AD converter circuit and an output circuit, respectively, the AD converter circuit being configured to perform analog-to-digital conversion in a time-interleaved manner, and the output circuit being configured to output the result of AD conversion by the AD converter circuit as an output signal; and a multiplexer circuit configured to generate a digital signal from output signals of the plurality of AD converter circuit units, the multiplexer circuit being a circuit in which a plurality of logic circuits are connected in a tournament configuration by a plurality of intermediate connection wirings, the designing method comprising:

placing, in a circuit layout of the AD converter device, the plurality of AD converter circuit units along a first direction with two adjacent ones of the plurality of AD converter circuit units set as a pair and with the output circuits and first element circuit parts included in the plurality of AD converter circuit units facing each other for each pair, wherein in each of the plurality of AD converter circuit units, the output circuit and the first element circuit part including at least one of the logic circuits are placed along a first outer periphery and the plurality of intermediate connection wirings are placed to cross in the first direction; and placing, in a circuit layout of the AD converter device, the multiplexer circuit by placing to be distributed the plurality of logic circuits and the plurality of intermediate connection wirings in the plurality of AD converter circuit units and connecting the plurality of the logic circuits in a tournament configuration using the plurality of intermediate connection wirings.

19. The designing method of the AD converter device according to claim 18, wherein in the placing the multiplexer circuit, according to the number of the plurality of AD converter circuit units, the logic circuit which constitutes the multiplexer circuit is placed in the first element circuit part located adjacent to a boundary between the pair of the plurality of AD converter circuit units for each stage of the tournament of the multiplexer circuit.

20. The designing method of the AD converter device according to claim 18, wherein in the case where the number of the plurality of AD converter circuit units is $2^n$ and the plurality of AD converter circuit units are able to be placed such that in each of the plurality of AD converter circuit units, in addition to the output circuit and the first element circuit part, a second element circuit part including the logic circuit is further placed along a second outer periphery facing the first outer periphery along which the output circuit and the first element circuit part are placed, the second element circuit part being different from the first element circuit part, in the placing the plurality of AD converter circuit units, the plurality of AD converter circuit units are placed along the first direction with two adjacent ones of the plurality of AD converter circuit units set as a pair and with the output circuits and the first element circuit parts in the plurality of AD converter circuit units facing each other for each pair, and in the placing the multiplexer circuit, the plurality of logic circuits each of which constitute the multiplexer circuit are placed in the first element circuit parts and the second element circuit parts located adjacent to all boundaries between the plurality of AD converter circuit units.

\* \* \* \* \*